(12) United States Patent
Esmaeil Zadeh et al.

(10) Patent No.: US 12,163,832 B2
(45) Date of Patent: Dec. 10, 2024

(54) SUPERCONDUCTING ELECTRONIC SIGNAL OUTPUT CIRCUIT AND READOUT ARRAY

(71) Applicant: SINGLE QUANTUM B.V., Delft (NL)

(72) Inventors: Iman Esmaeil Zadeh, Delft (NL); Johannes Willem Nicolaas Los, Leiderdorp (NL); Jin Chang, Delfgauw (NL)

(73) Assignee: SINGLE QUANTUM B.V., Delft (NL)

( * ) Notice: Subject to any disclaimer, the term of this patent is extended or adjusted under 35 U.S.C. 154(b) by 0 days.

(21) Appl. No.: 18/706,522

(22) PCT Filed: Oct. 14, 2022

(86) PCT No.: PCT/EP2022/078606
§ 371 (c)(1),
(2) Date: May 1, 2024

(87) PCT Pub. No.: WO2023/083558
PCT Pub. Date: May 19, 2023

(65) Prior Publication Data
US 2024/0328856 A1    Oct. 3, 2024

(30) Foreign Application Priority Data

Nov. 11, 2021 (NL) .................................... 2029724

(51) Int. Cl.
*G01J 1/44*    (2006.01)
(52) U.S. Cl.
CPC ........... *G01J 1/44* (2013.01); *G01J 2001/448* (2013.01)

(58) Field of Classification Search
CPC ... G01J 1/44; G01J 2001/442; G01J 2001/448
See application file for complete search history.

(56) References Cited

U.S. PATENT DOCUMENTS 10,171,086 B2 * 1/2019 McCaughan .......... H10N 60/35
11,569,816 B1 * 1/2023 Najafi .................... H10N 60/35

FOREIGN PATENT DOCUMENTS

WO    2014/197048 A2    12/2014

OTHER PUBLICATIONS

International Search Report and Written Opinion in International Application No. PCT/EP2022/078606, mailed on Jan. 20, 2023, 13 pages.

(Continued)

*Primary Examiner* — Kevin K Pyo
(74) *Attorney, Agent, or Firm* — KDW Firm PLLC

(57) ABSTRACT

A superconducting electronic signal output circuit includes a signal source section configured to provide a voltage and/or current signal. The signal source section comprises a superconducting nanowire single photon detector, SNSPD, a switchable output section connected to the signal source section and having a first superconducting switch configured to selectably cause the signal to be output to an output of the superconducting electronic signal output circuit, and a switchable sink section connected to the signal source section and the switchable output section and having a second superconducting switch configured to selectably cause the signal to be directed to a reference potential.

17 Claims, 3 Drawing Sheets

(56) References Cited

OTHER PUBLICATIONS

Dauler et al., "Review of Superconducting nanowire single-photon detector system design options and demonstrated performance," Optical Engineering, Aug. 2014, 53(8):81907-1-81907-13.

Zhang et al., "Development of superconducting nanowire single-photon detector arrays for applications in SIMIT," Proc. of SPIE, May 18, 2020, 11386: 113860Q-1-13860Q-10.

Cahall et al., "Scalable cryogenic readout circuit for a superconducting nanowire single-photon detector system," Review of Scientific Instruments, Jun. 18, 2018, 89(6):063117-1-063117-7.

Baghdadi et al., "Multilayered Heater Nanocryotron: A Superconducting-Nanowire-Based Thermal Switch," Physical Review Applied 14, 2020, 054011-1-054011-12.

* cited by examiner

SUPERCONDUCTING ELECTRONIC SIGNAL OUTPUT CIRCUIT AND READOUT ARRAY

This is a national stage application filed under 35 U.S.C. § 371 of pending international application PCT/EP2022/078606, filed Oct. 14, 2022, which claims priority to Netherlands Patent Application No. 2029724, filed Nov. 11, 2021, the entirety of which applications are hereby incorporated by reference herein.

The present invention relates to improved superconducting electronic signal output circuits, in particular improved superconducting electronic signal output circuits for readout of arrays of Superconducting Nanowire Single-Photon Detectors (SNSPDs), with improved scalability and addressability.

Superconducting Nanowire Single-Photon detectors (SNSPDs) typically comprise a superconducting detector for detecting photons. In such detectors, the resistance of the detector is typically zero when in a superconducting state, while a resistance is developed upon impact of a photon on the active surface of the detector. From the publication 'Multilayered Heater Nanocryoptron: A superconducting nanowire based thermal switch' by Reza Baghdadi, et al., PHYSICAL REVIEW APPLIED 14, 2020, is the use of a Joule switch for a readout circuit of such SNSPDs known.

An object of the invention, next to other objects, is to provide superconducting electronic signal output circuits with increased scalability and addressability.

This object, next to other objects, is met by a superconducting electronic signal output circuit according to claim 1. Specifically, this is met by a superconducting electronic signal output circuit comprising a signal source section configured to provide a voltage and/or current signal; a switchable output section connected to the signal source section and comprising a first superconducting switch configured to selectably cause the signal to be output to an output of the superconducting electronic output circuit; and a switchable sink section connected to the signal source section and the switchable output section and comprising a second superconducting switch configured to selectably cause the signal to be directed to a reference potential. By using a switchable output section and a switchable sink section, the output of the superconducting electronic signal output circuit can selectively output the signal from the signal source section or isolate the signal of the source section. In this way, the addressing of the signal from the signal source section can be improved.

According to a preferred embodiment, the switchable output section and the switchable sink section are configured such that, when the second superconducting switch is closed and superconducting, the signal is directed to the reference potential. In this way, the signal from the signal source section is ensured to the reference potential, in particular to the ground, and the output is isolated from the signal source section. This ensures no possible crosstalk on the output when the superconducting electronic signal output circuit is not being actively addressed.

According to a preferred embodiment, the switchable output section comprises a first impedance between the signal source section and the first superconducting switch so that, when the first and second superconducting switches are both in a superconducting state, the signal is directed to the sink. In this way, a path from the switchable source section to the reference potential is created. In this way, a higher impedance path is created on the output side while a preferential low impedance, in particular zero resistance, path towards the reference potential is created on the sink side. The additional impedance in the path of the first superconducting switch acts as an offset ensuring pulses travel to the reference potential through the second superconducting switch when superconducting.

According to a preferred embodiment, the signal source section, the switchable output section and the switchable sink section are connected via a three-way junction. In this way, the signal from the switchable source sections is routed either to the reference potential or to the output.

The signal source section preferably comprises a superconducting nanowire single photon detector, SNSPD. In this way, the signal from the signal source section is based on the status of a superconducting nanowire single photon detector. Although arranged for SNSPDs and photon detectors in general, the superconducting electronic signal output circuit could also be arranged for other optical devices. The principle of addressing the readout of an optical sensor using a superconducting electronic signal output circuit described here is therefore not limited to single photon detectors with superconducting nanowire insofar as the concept of an individual addressing using two complementary superconducting switches disclosed here may also be declined accordingly for other types of single pixel or multi-pixel optical detectors.

According to a preferred embodiment, the signal source section comprises a bias resistor, wherein the bias resistor and the SNSPD are in series in between a bias voltage source and the reference potential, such that the resistor and the SNSPD form a voltage divider outputting the signal(S) of the signal source section. In this way, when the SNSPD does not detect any photon, the signal source section delivers a signal at the reference potential, and when the SNSPD detects a photon, the amplitude of the signal delivered by the source section is determined by the load impedance and the current through the nanowire when it was superconducting, wherein the load impedance is the equivalent load impedance of the rest of the circuit seen by the signal source section.

According to a preferred embodiment, the superconducting electronic signal output circuit comprises a second impedance, preferably resistor or a capacitor, between the signal source section and the switchable output section. The additional impedance in the path from the signal source section acts as a barrier between the signal source section and the switchable output section, isolating both DC and AC signals.

According to a preferred embodiment, the first and second superconducting switches are configured to switch from a superconducting state to a not superconducting state and vice versa. In this way, fast superconducting switches can be realised.

According to a preferred embodiment, a control circuitry is further provided for generating control signals so that only one of the first and second superconducting switches per bus is on at any time. In this way, the readout bus is protected against any crosstalk.

Preferably, at least one of the first and second superconducting switches is controlled via a heater to switch from the superconducting state to a not superconducting state. According to a preferred embodiment, the first and second superconducting switches are each controlled via one or more heaters powered by the control lines and configured to controllably apply heat to the first and second superconductive switches in order to cause the switching from the superconducting state to a not superconducting state. In this way, Joule switches can be used as the first and second superconducting switches. In particular the fabrication of such fast nanoscale superconducting switches is well suited to be combined with the fabrication of SNPD detectors. More in particular, the first and second superconducting switches and their respective heaters are each formed as a multilayer heater-nanocryotron (M-hTron).

According to a further aspect, a superconducting electronic signal readout array is provided. The readout array comprises an array of superconducting electronic signal output circuits according to any one of previous embodiments. The superconducting electronic signal output circuits are positioned in one or more rows and one or more columns. The superconducting electronic signal readout array preferably comprises one or more superconducting readout lines configured to be connected to one or more column readout buses, wherein one or more readout lines, of a column readout bus are connected to the respective switchable output section of a superconducting electronic signal output circuit positioned along the respective column of that respective column readout bus. In this way an array of optical detectors and their superconducting electronic signal output circuits may be realised for multi-pixel applications.

According to a preferred embodiment, one or more first control lines are positioned along the one or more rows. A first control line of a row is configured to control one or more first superconducting switches of the one or more superconducting electronic signal output circuits of that row. One or more second control lines are positioned along the one or more rows. A second control line of a row is configured to control one or more second superconducting switches of the one or more superconducting electronic signal output circuits of that row. In this way, a one control line may be used to address one or more columns. This arrangement enables thus to decrease the required addressing.

According to a preferred embodiment, the superconducting electronic signal output circuits are positioned in at least one row and a plurality of columns. A first control line associated with a row is configured to control at least two first superconducting switches (21) of the superconducting electronic signal output circuits (100ij) of that row, and a second control line associated with a row is configured to control at least two second superconducting switches (22) of the superconducting electronic signal output circuits (100ij) of that row. In this way the addressing per row is reduced. The superconducting electronic signal output circuits may also be positioned in only one row and more than one column. In such a configuration, the switchable sink sections in the output circuits and the second control lines may be omitted.

According to a preferred embodiment, when one or more second superconducting switches positioned along a row are in the superconducting state, the respective signals of the one or more respective signal source sections are directed to the reference potential, and when one or more second superconducting switches positioned along a row are in the not superconducting state and the one or more respective first superconducting switches positioned along that same row are in a superconducting state, the one or more respective signals of the respective signal source sections are each directed to a respective column readout bus.

In this way the respective signals of all the signal source sections in one row can be directed to their respective column readout bus simultaneously. In other words, if an SNSPD corresponds to a pixel, the array allows the simultaneous readout of a row of pixels by proper addressing of the control lines of that row. This arrangement enables thus to decrease the required addressing and the number of readout buses.

According to a preferred embodiment, a control circuit is further provided for generating control signals to power the one or more first and second control lines. The control circuit is configured such that when a first superconducting switch positioned along a column is in a superconducting state, all the remaining first switches connected to the column readout bus of that column are in the not superconducting state. In this way crosstalk in between the readouts of detectors of the same column is prevented.

According to a preferred embodiment, at least one of the first and second control lines is configured to supply current to one or more heaters so that heat is generated and the one or more respective superconducting switches turn to the not superconducting state. In this way the superconducting state of fast superconducting switches can be easily controlled.

According to a preferred embodiment, a photon detector system comprising a superconducting electronic signal readout array according to any of the previous embodiments is provided. In this way a complete system with efficient individual addressing for a multi-pixel application may be realised.

This and other aspects of the present invention will now be described in more detail, with reference to the appended drawings showing currently preferred embodiments of the invention, wherein.

Figure 1:
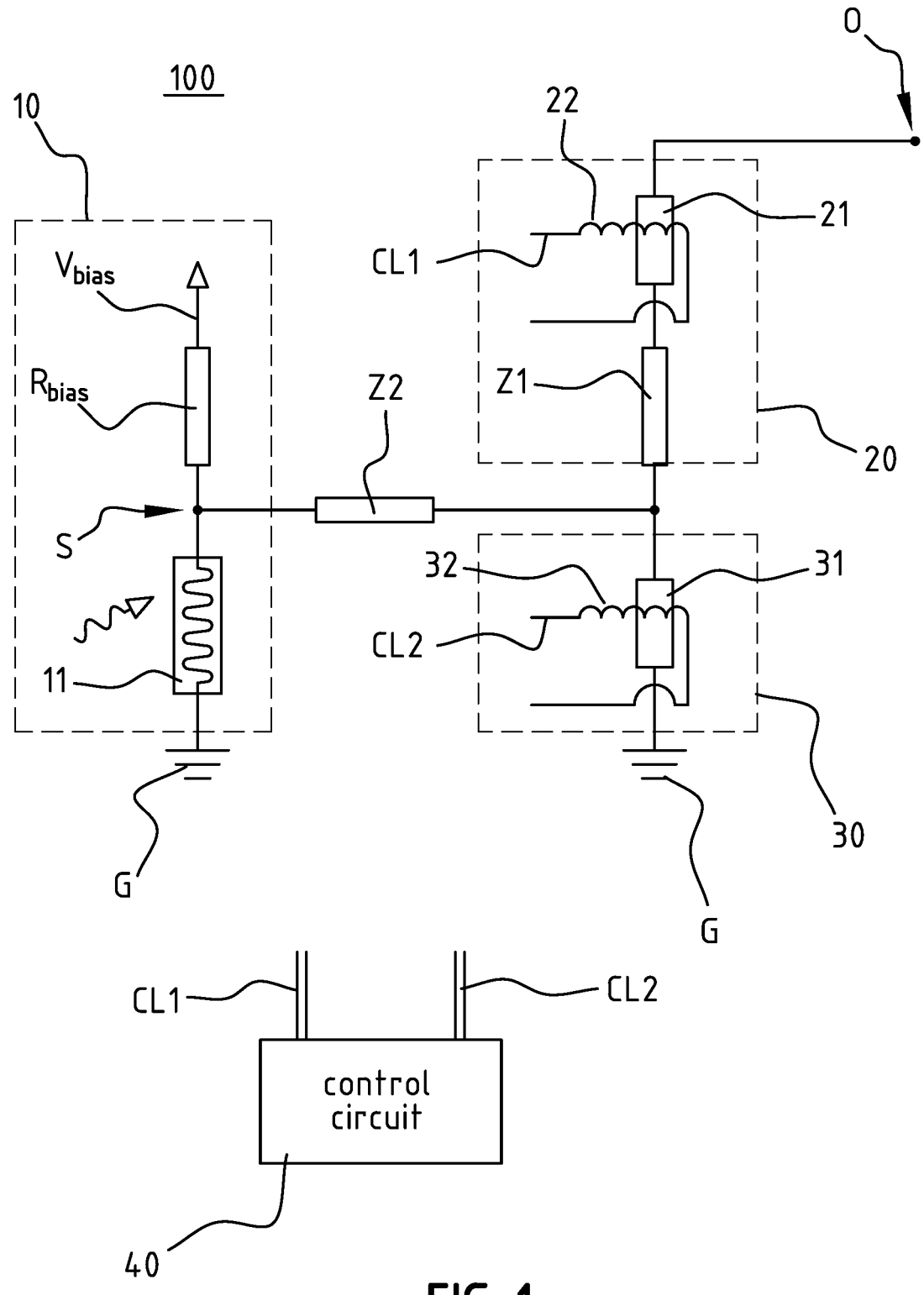
FIG. 1 illustrates the schematic representation of a superconducting electronic signal output circuit according to an embodiment.

FIG. 1 illustrates a schematic representation of a superconducting electronic signal output circuit 100. The superconducting electronic signal output circuit 100 comprises a signal source section 10 configured to provide a voltage and/or current signal S, a switchable output section 20 connected to the signal source section 10 and a switchable sink section 30 connected to the signal source section 10 and the switchable output section 20.

The switchable output section 20 comprises a first superconducting switch 21 configured to selectably cause the signal S to be output to an output O of the superconducting electronic output circuit. The switchable sink section 30 comprises a second superconducting switch 31 configured to selectably cause the signal S to be directed to a reference potential G. The reference potential G is for example a ground potential. A superconducting switch 21, 31 has a variable equivalent resistance $R_{eq}$. When a superconducting switch 21 or 31 is closed, such an element is in a superconducting state and its equivalent resistance is null, while when open, a superconducting switch 21 or 31 is in a not superconducting state, such that its equivalent resistance is high, typically in the order of 5 k$\Omega$.

The switchable output section 20 and the switchable sink section 30 are configured such that, when the second superconducting switch 31 is closed and superconducting, the signal S is directed to the reference potential G. The first and second superconducting switches 21, 31 are configured to switch from a superconducting state to a not superconducting state and vice versa. The first and the second superconducting switches 21 and 31 are for example controlled in a complementary manner. In other words, only one of the first and second superconducting switches 21 and 31 is active at a time: when one is closed and superconducting, the other one is open and in a high impedance state.

The switchable output section 20 comprises a first impedance Z1 between the signal source section 10 and the first superconducting switch 21 so that, if the first and second superconducting switches 21, 31 would both be in a superconducting state, the signal S would still be directed to the reference potential G. The signal source section 10, the switchable output section 20 and the switchable sink section 30 are in particular connected via a three-way junction that is between the first impedance Z1 and the second superconducting switch 31.

The signal source section 10 comprises a superconducting nanowire single photon detector (SNSPD) 11. Typically, the SSNPD comprises an active surface on which a superconducting nanowire is disposed. The superconducting nanowire is arranged typically as a meander covering the whole active surface. The nanowire has an inductance $L_p$ and a variable hot-spot resistance $R_{hs}$. When the nanowire is in its superconducting state, its resistance $R_{hs}$ is null, while when the nanowire detects a photon hitting the active surface, it develops a resistance $R_{hs}$ in the order typically of 1 kΩ.

The signal source section 10 further comprises a bias resistor $R_{bias}$. The bias resistor $R_{bias}$ and the SNSPD 11 are connected in series in between a bias voltage source Vbias and the reference potential G, such that the bias resistor $R_{bias}$ and the SNSPD 11 form a voltage divider outputting the signal S of the signal source section when the SSNPD is not superconducting. The signal S is output from a junction point in between $R_{bias}$ and the SNSPD 11. The signal S is thus either at the reference potential when the SNSPD is its superconducting state, or a pulse with a potential varying over time based among others on $R_{hs}$, $R_{bias}$, the load impedance and $V_{bias}$.

The superconducting electronic signal output circuit 100 comprises a second impedance Z2, preferably a resistor or a capacitor, between the signal source section 10 and the switchable output section 20. The second impedance is connected on one side to the junction point in between $R_{bias}$ and the SNSPD 11, and on the other side to the junction point in between the first impedance Z1 and the second superconducting switch 31.

The superconducting electronic signal output circuit 100 further comprises a control circuitry 40 for generating control signals VC1 and VC2 and powering accordingly control lines CL1 and CL2 for respectively controlling the first and second superconducting switches 21 and 31. The control circuitry 40 is configured to generate complementary control signals so that only one of the first and second superconducting switches 21, 31 is on and superconducting at any time.

The first and second superconducting switches 21, 31 are each controlled via one or more heaters 22, 32 powered by the control lines CL1, CL2. The heaters 22 and 32 are configured to controllably apply heat to respectively the first and second superconductive switches 21 and 31 in order to cause the switching from the superconducting state to the non-superconducting state. The heaters 22 and 32 are placed in close proximity of their superconducting switches 21 and 31, typically over their superconducting switches 21 and 31. When a heater 22, 32 is activated, the heat generated by the heater in question makes the associated switch change from a superconducting state into the non-superconducting state.

In an embodiment, the first and second superconducting switches 21, 31 and their respective heaters 22, 32 are each formed as a multilayer heater-nanocryotron (M-hTron). It is noted that in FIG. 1 a superconducting switch SW like 21 or 31 has been schematically represented as a rectangle similar to the typical representation of an impedance. A superconducting switch SW is controlled by an associated heater H to change between two states. The heater H has been represented as a coil located physically close to the superconducting switch. In a first state, when the heater is off, which corresponds to the control signal VC, on the control line CL feeding the heater being null, the superconducting switch is in a superconducting state and has a resistance $R_{eq}$ that is null. In this first state the superconducting switch acts as a closed switch. In a second state, when the heater is on, which corresponds to the control signal VC, on the control line CL feeding the heater H, being at a high value, the superconducting switch is not in a superconducting state and develops a high resistance $R_{eq}$, typically in the order of 5Ω. In this second state, the superconducting switch as an open switch.

The SNSPD has been schematic represented as a rectangle similar to the typical representation of an impedance, with additionally a meander inside representing a superconducting nanowire. The SNSPD operates as well in two states. In a first state, when no photon is received, the SNSPD is in a superconducting state and its hot-spot resistance $R_{hs}$ is null. Upon detecting a photon, the SNSPD develops a hot spot resistance $R_{hs}$ in the order of 1Ω. Such an SNPD may be used as pixel detector.

Figure 2:
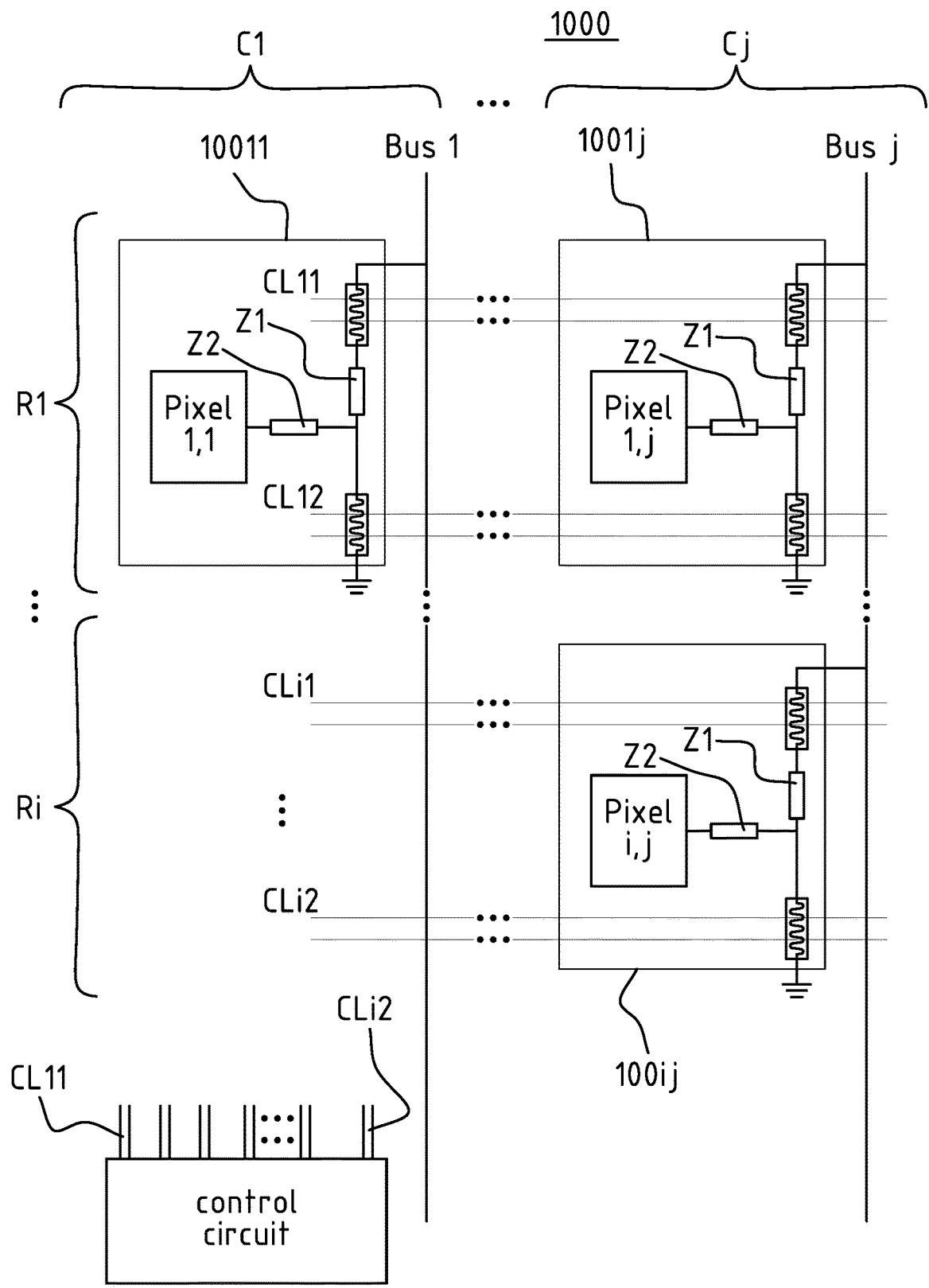
FIG. 2 illustrates a schematic representation of a superconducting electronic signal readout array for a multi-pixel detector.

FIG. 2 illustrates a schematic representation of a superconducting electronic signal readout array 1000. The superconducting electronic signal readout array 1000 comprises an array of superconducting electronic signal output circuits 100ij according to FIG. 1. The superconducting electronic signal output circuits 100ij are positioned in a plurality of rows i and one or more columns j. Although not represented, a separate SNSPD is respectively associated with each superconducting electronic signal output circuits 100ij, to obtain an array of SNSPDs positioned in a plurality of rows i and one or more columns j. In practice the SNSPDs are located in close proximity of each other to form in combination a large multi-pixel detection area. The array 1000 further comprises a plurality of superconducting readout lines Oij configured to be connected to one or more column readout buses Bus-j. Each readout line Oij of a column readout bus Bus-j is connected to the respective switchable output section 20ij of a superconducting electronic signal output circuit 100ij positioned along the respective column of that respective column readout bus Bus-j.

The array 1000 further comprises a first plurality of first control lines CLi1 positioned along the rows i and a second plurality of second control lines CLi2 positioned along the rows i.

Each first control line of a row i is configured to control simultaneously all the first superconducting switches 21 of the superconducting electronic signal output circuits 100ij of that row i. Similarly each second control line of a row i is configured to control simultaneously all the second superconducting switches 22 of the superconducting electronic signal output circuits 100ij of that row i. In other words, a complete row i of superconducting signal output circuits 100ij is controlled using only one first control line CLi1 and one second control line CLi2.

This means that when the second superconducting switches positioned along a row are in the superconducting state, the respective signals of the respective signal source sections are directed to the reference potential, and when the second superconducting switches positioned along a row are in the not superconducting state and the respective first superconducting switches positioned along that same row are in a superconducting state, the respective signals of the respective signal source sections are each directed to a respective column readout bus. In this way the respective signals of all the signal source sections in one row can be directed to their respective column readout bus simultaneously. In other words, if an SNSPD corresponds to a pixel, the array 1000 allows the simultaneous readout of a row of pixels by proper addressing of the control lines of that row. This arrangement enables thus to decrease the required addressing while the number of readout buses is limited to one per column.

The superconducting electronic signal readout array 1000 further comprises a control circuit 200 for generating control signals to power the first and the second plurality of first and second control lines CLi1, Cli2. The control circuit 200 is configured to generate control signals for powering the first and the second plurality of first and second control lines such that when a first superconducting switch positioned along a column is in a superconducting state, all the remaining first switches of that column are in the not superconducting state. This control inside a column prevents crosstalk in between the readouts of detectors of the same column, since only one detector per column at a time can be read.

As in FIG. 1, the first and second plurality of first and second control lines CLi1, CLi2 are configured to supply current to respectively a first and a second plurality of heaters in proximity with the first and second superconducting switches so that heat is generated and the respective superconducting switches turn to the not superconducting state.

Figure 3:
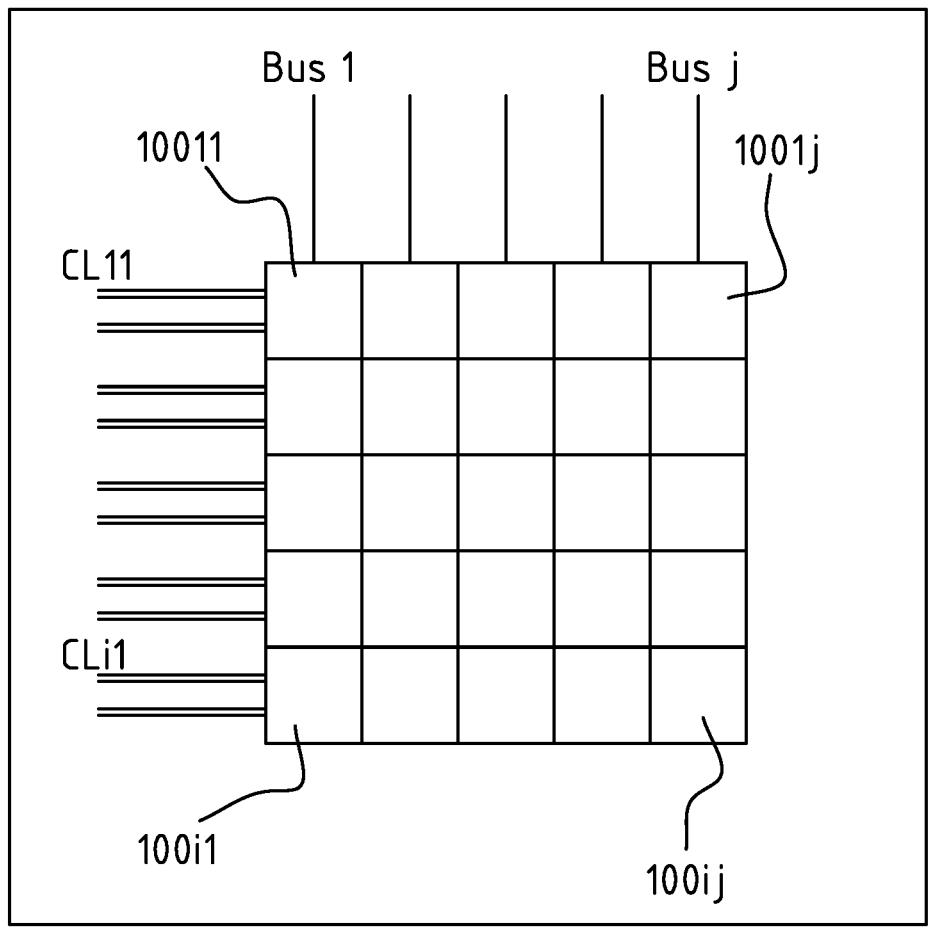
FIG. 3 illustrates a schematic practical chip implementation of a photon detector system comprising a multi-pixel detector and readout array.

FIG. 3 illustrates a schematic practical chip implementation of a photon detector system comprising a multi-pixel detector and readout array according to an embodiment. After the fabrication of the detectors, an extra lithography step is performed to form the superconducting switches. Both the detectors and the superconducting electronic signal output circuits are thus integrated together on the same chip support, leading to an efficient and accurate fabrication process.

Whilst the principles of the invention have been set out above in connection with specific embodiments, it is understood that this description is merely made by way of example and not as a limitation of the scope of protection which is determined by the appended claims.

The disclosure further comprises the following embodiments.

1. A superconducting electronic signal output circuit for in a photon detector system comprising
   a signal source section (10) configured to provide a voltage and/or current signal(S), wherein the signal source section (10) comprises a superconducting nanowire single photon detector, SNSPD (11);
   a switchable output section (20) connected to the signal source section (10) and comprising a first superconducting switch (21) configured to selectably cause the signal(S) to be output to an output (O) of the superconducting electronic signal output circuit; and
   a switchable sink section (30) connected to the signal source section (10) and the switchable output section (20) and comprising a second superconducting switch (31) configured to selectably cause the signal to be directed to a reference potential (G).

2. Superconducting electronic signal output circuit according to embodiment 1, wherein the switchable output section (20) and the switchable sink section (30) are configured such that, when the second superconducting switch (32) is closed and superconducting, the signal is directed to the reference potential (G).

3. Superconducting electronic signal output circuit according to embodiment 1 or 2, wherein the switchable output section (20) comprises a first impedance (Z1) between the signal source section (10) and the first superconducting switch (21) so that, when the first and second superconducting switches (21, 31) are both in a superconducting state, the signal is directed to the reference potential (G).

4. Superconducting electronic signal output circuit according to embodiment 3, wherein the signal source section (10), the switchable output section (20) and the switchable sink section (30) are connected via a three-way junction that is between the first impedance (Z1) and the second superconducting switch (31).

5. Superconducting electronic signal output circuit according to embodiment 1, wherein the signal source section further comprises a bias resistor, wherein the bias resistor and the SNSPD are in series in between a bias voltage source and the reference potential, such that the resistor and the SNSPD form a voltage divider outputting the signal(S) of the signal source section.

6. Superconducting electronic signal output circuit according to embodiment 5, wherein the superconducting electronic signal output circuit comprises a second impedance (Z2), preferably a resistor or a capacitor, between the signal source section (10) and the switchable output section (20).

7. Superconducting electronic signal output circuit according to any one of embodiments 1 to 6, wherein the first and second superconducting switches (21, 31) are configured to switch from a superconducting state to a not superconducting state and vice versa.

8. Superconducting electronic signal output circuit according to any one of embodiments 1 to 7, further comprising a control circuitry (40) being configured to generate control signals so that only one of the first and second superconducting switches (21, 31) is on at any time.

9. Superconducting electronic signal output circuit according to embodiments 7 or 8, wherein at least one of the first and second superconducting switches (21, 31) is controlled via a heater (22, 32) powered by a control line (CL1, CL2) and configured to controllably apply heat to the at least one of the first and second superconductive switches (21, 31) in order to cause the switching from the superconducting state to a not superconducting state.

10. Superconducting electronic signal output circuit according to any of embodiments 7 to 9, wherein the first and second superconducting switches (21, 31) and their respective heaters (22, 32) are each formed as a multilayer heater-nanocryotron (M-hTron).

11. Superconducting electronic signal readout array (1000) comprising
   an array of superconducting electronic signal output circuits (100ij) according to any one of embodiment 1 to 10, wherein the superconducting electronic signal output circuits (100ij) are positioned in one or more rows (i) and one or more columns (j);
   one or more superconducting readout lines (Oij) configured to be connected to one or more column readout buses (Bus-j), wherein one or more readout lines of a column readout bus are connected to the respective switchable output section (20ij) of a superconducting electronic signal output circuit (100*ij*) positioned along the respective column of that respective column readout bus.

12. Superconducting electronic signal readout array according to embodiment 11, further comprising:
one or more first control lines (CLi1) positioned along the one or more rows (i), a first control line associated with a row being configured to control one or more first superconducting switches (21) of the one or more superconducting electronic signal output circuits (100*ij*) of that row; and
one or more second control lines (CLi2) positioned along the one or more rows (i), a second control line associated with a row being configured to control one or more second superconducting switches (22) of the one or more superconducting electronic signal output circuits (100*ij*) of that row.

13. Superconducting electronic signal readout array according to embodiment 12, wherein the superconducting electronic signal output circuits are positioned in at least one row and a plurality columns, and wherein a first control line associated with a row is configured to control at least two first superconducting switches (21) of the superconducting electronic signal output circuits (100*ij*) of that row, and wherein a second control line associated with a row is configured to control one or more second superconducting switches (22) of the superconducting electronic signal output circuits (100*ij*) of that row 14. Superconducting electronic signal readout array according to any one of embodiments 11 to 13, wherein, when one or more second superconducting switches positioned along a row are in the superconducting state, the one or more respective signals of the respective signal source sections are directed to the reference potential, and when one or more second superconducting switches positioned along a row are in the not superconducting state and the one or more respective first superconducting switches positioned along that same row are in a superconducting state, the one or more respective signals of the respective signal source sections are each directed to a respective column readout bus.

15. Superconducting electronic signal readout array according to any one of embodiments 12 to 14, further comprising a control circuit for generating control signals to power the one or more first and second control lines, the control circuit being configured such that when a first superconducting switch positioned along a column is in a superconducting state, all the remaining first switches connected to the column readout bus of that column are in the not superconducting state.

16. Superconducting electronic signal readout array according to any of embodiments 11 to 15, wherein at least one of the one or more first and second control lines is configured to supply current to one or more heaters so that heat is generated and the respective one or more superconducting switches turn to the not superconducting state.

17. A photon detector system comprising a superconducting electronic signal readout array according to any of embodiments 11 to 16.

The invention claimed is:
1. A superconducting electronic signal output circuit for in a photon detector system, comprising
a signal source section configured to provide a voltage and/or current signal, wherein the signal source section comprises a superconducting nanowire single photon detector, SNSPD;
a switchable output section connected to the signal source section and comprising a first superconducting switch configured to selectably cause the signal to be output to an output of the superconducting electronic signal output circuit; and
a switchable sink section connected to the signal source section and the switchable output section and comprising a second superconducting switch configured to selectably cause the signal to be directed to a reference potential.

2. The superconducting electronic signal output circuit according to claim 1, wherein the switchable output section and the switchable sink section are configured such that, when the second superconducting switch is closed and superconducting, the signal is directed to the reference potential.

3. The superconducting electronic signal output circuit according to claim 1, wherein the switchable output section comprises a first impedance between the signal source section and the first superconducting switch so that, when the first and second superconducting switches are both in a superconducting state, the signal is directed to the reference potential.

4. The superconducting electronic signal output circuit according to claim 3, wherein the signal source section, the switchable output section and the switchable sink section are connected via a three-way junction that is between the first impedance and the second superconducting switch.

5. The superconducting electronic signal output circuit according to claim 1, wherein the signal source section further comprises a bias resistor, wherein the bias resistor and the SNSPD are in series in between a bias voltage source and the reference potential, such that the resistor and the SNSPD form a voltage divider outputting the signal of the signal source section.

6. The superconducting electronic signal output circuit according to claim 5, wherein the superconducting electronic signal output circuit comprises a second impedance, preferably a resistor or a capacitor, between the signal source section and the switchable output section.

7. The superconducting electronic signal output circuit according to claim 1, wherein the first and second superconducting switches are configured to switch from a superconducting state to a not superconducting state and vice versa.

8. The superconducting electronic signal output circuit according to claim 1, further comprising a control circuitry being configured to generate control signals so that only one of the first and second superconducting switches is on at any time.

9. The superconducting electronic signal output circuit according to claim 7, wherein at least one of the first and second superconducting switches is controlled via a heater powered by a control line and configured to controllably apply heat to the at least one of the first and second superconductive switches in order to cause the switching from the superconducting state to a not superconducting state.

10. The superconducting electronic signal output circuit according to claim 7, wherein the first and second superconducting switches and their respective heaters are each formed as a multilayer heater-nanocryotron (M-hTron).

11. A superconducting electronic signal readout array comprising
array of superconducting electronic signal output circuits according to claim 1, wherein the superconducting electronic signal output circuits are positioned in one or more rows and one or more columns;

one or more superconducting readout lines configured to be connected to one or more column readout buses, wherein one or more readout lines of a column readout bus are connected to the respective switchable output section of a superconducting electronic signal output circuit positioned along the respective column of that respective column readout bus.

12. The superconducting electronic signal readout array according to claim 11, further comprising:

one or more first control lines positioned along the one or more rows, a first control line associated with a row being configured to control one or more first superconducting switches of the one or more superconducting electronic signal output circuits of that row; and one or more second control lines positioned along the one or more rows, a second control line associated with a row being configured to control one or more second superconducting switches of the one or more superconducting electronic signal output circuits of that row.

13. The superconducting electronic signal readout array according to claim 12, wherein the superconducting electronic signal output circuits are positioned in at least one row and a plurality columns, and wherein a first control line associated with a row is configured to control at least two first superconducting switches of the superconducting electronic signal output circuits of that row, and wherein a second control line associated with a row is configured to control one or more second superconducting switches of the superconducting electronic signal output circuits of that row.

14. The superconducting electronic signal readout array according to claim 11, wherein, when one or more second superconducting switches positioned along a row are in the superconducting state, the one or more respective signals of the respective signal source sections are directed to the reference potential, and when one or more second superconducting switches positioned along a row are in the not superconducting state and the one or more respective first superconducting switches positioned along that same row are in a superconducting state, the one or more respective signals of the respective signal source sections are each directed to a respective column readout bus.

15. The superconducting electronic signal readout array according to claim 12, further comprising a control circuit for generating control signals to power the one or more first and second control lines, the control circuit being configured such that when a first superconducting switch positioned along a column is in a superconducting state, all the remaining first switches connected to the column readout bus of that column are in the not superconducting state.

16. The superconducting electronic signal readout array according to claim 11, wherein at least one of the one or more first and second control lines is configured to supply current to one or more heaters so that heat is generated and the respective one or more superconducting switches turn to the not superconducting state.

17. A photon detector system comprising a superconducting electronic signal readout array according to claim 11.

* * * * *